(12) United States Patent
Khanna

(10) Patent No.: US 6,838,022 B2
(45) Date of Patent: Jan. 4, 2005

(54) ANISOTROPIC CONDUCTIVE COMPOUND

(75) Inventor: S. Kumar Khanna, Carmel, IN (US)

(73) Assignee: Nexaura Systems, LLC, Carmel, IN (US)

(*) Notice: Subject to any disclaimer, the term of this patent is extended or adjusted under 35 U.S.C. 154(b) by 185 days.

(21) Appl. No.: 10/205,251

(22) Filed: Jul. 25, 2002

(65) Prior Publication Data

US 2004/0016911 A1 Jan. 29, 2004

(51) Int. Cl.$^7$ ............................................... H01B 1/22
(52) U.S. Cl. ..................................... 252/513; 252/514
(58) Field of Search .............................. 252/512, 513, 252/514; 428/403

(56) References Cited

U.S. PATENT DOCUMENTS

| | | | |
|---|---|---|---|
| 4,170,677 A | 10/1979 | Hutcheson ................ 428/119 |
| 4,568,592 A | 2/1986 | Kawaguchi et al. ........ 428/107 |
| 4,737,112 A | 4/1988 | Jin et al. |
| 4,772,422 A | 9/1988 | Hijikata et al. ............. 252/511 |
| 4,878,978 A | 11/1989 | Goel et al. ................ 156/272.4 |
| 4,966,729 A | 10/1990 | Carmona et al. ............ 252/511 |
| 5,045,249 A | 9/1991 | Jin et al. |
| 5,162,087 A | 11/1992 | Fukuzawa et al. .......... 252/500 |
| 5,169,471 A | 12/1992 | Strasser ................... 156/272.4 |
| 5,225,966 A * | 7/1993 | Basavanhally et al. ..... 361/774 |
| 5,236,631 A | 8/1993 | Osawa ...................... 252/512 |
| 5,286,417 A | 2/1994 | Mahmoud et al. ........... 252/518 |
| 5,344,593 A * | 9/1994 | Chiba et al. ................ 252/514 |
| 5,429,701 A | 7/1995 | Lu ........................... 156/272.4 |
| 5,453,148 A | 9/1995 | Lu et al. ................... 156/272.2 |
| 5,522,962 A | 6/1996 | Koskenmaki et al. ..... 156/272.4 |
| 5,769,996 A | 6/1998 | McArdle et al. .......... 156/272.4 |
| 5,785,913 A | 7/1998 | Clark, Jr. et al. ........... 264/109 |
| 5,840,215 A | 11/1998 | Iyer et al. .................... 252/500 |
| 5,851,644 A | 12/1998 | McArdle et al. ............ 428/213 |
| 5,891,366 A | 4/1999 | Gruenwald et al. ......... 252/514 |
| 5,965,064 A * | 10/1999 | Yamada et al. ............. 252/512 |
| 6,039,896 A | 3/2000 | Miyamoto et al. .......... 252/511 |
| 6,048,599 A | 4/2000 | Chu et al. ................... 428/114 |
| 6,110,399 A | 8/2000 | McArdle et al. ............ 252/513 |
| 6,149,857 A | 11/2000 | McArdle et al. ............ 264/429 |
| 6,171,107 B1 | 1/2001 | Milne ......................... 433/189 |
| 6,190,509 B1 | 2/2001 | Haba |

* cited by examiner

*Primary Examiner*—Mark Kopec
(74) *Attorney, Agent, or Firm*—Webb Ziesenheim Logsdon Orkin & Hanson P.C.

(57) ABSTRACT

An anisotropic conductive compound includes an electrically conducting material suspended in a binder. The electrically conducting material includes nickel coated particles having a coating of silver or gold over the nickel coat and/or gold or silver coated nickel particles. In one embodiment, the binder is formed from the reaction product of a catalyst and a compound comprising an aromatic epoxy resin, a dimer fatty acid diglycidyl ester and oxirane. In another embodiment, the binder is formed from the reaction product of a novalac resin, a catalyst and either a heat polymerized aromatic epoxy resin or a phenoxy modified epoxy novalac resin.

20 Claims, 3 Drawing Sheets

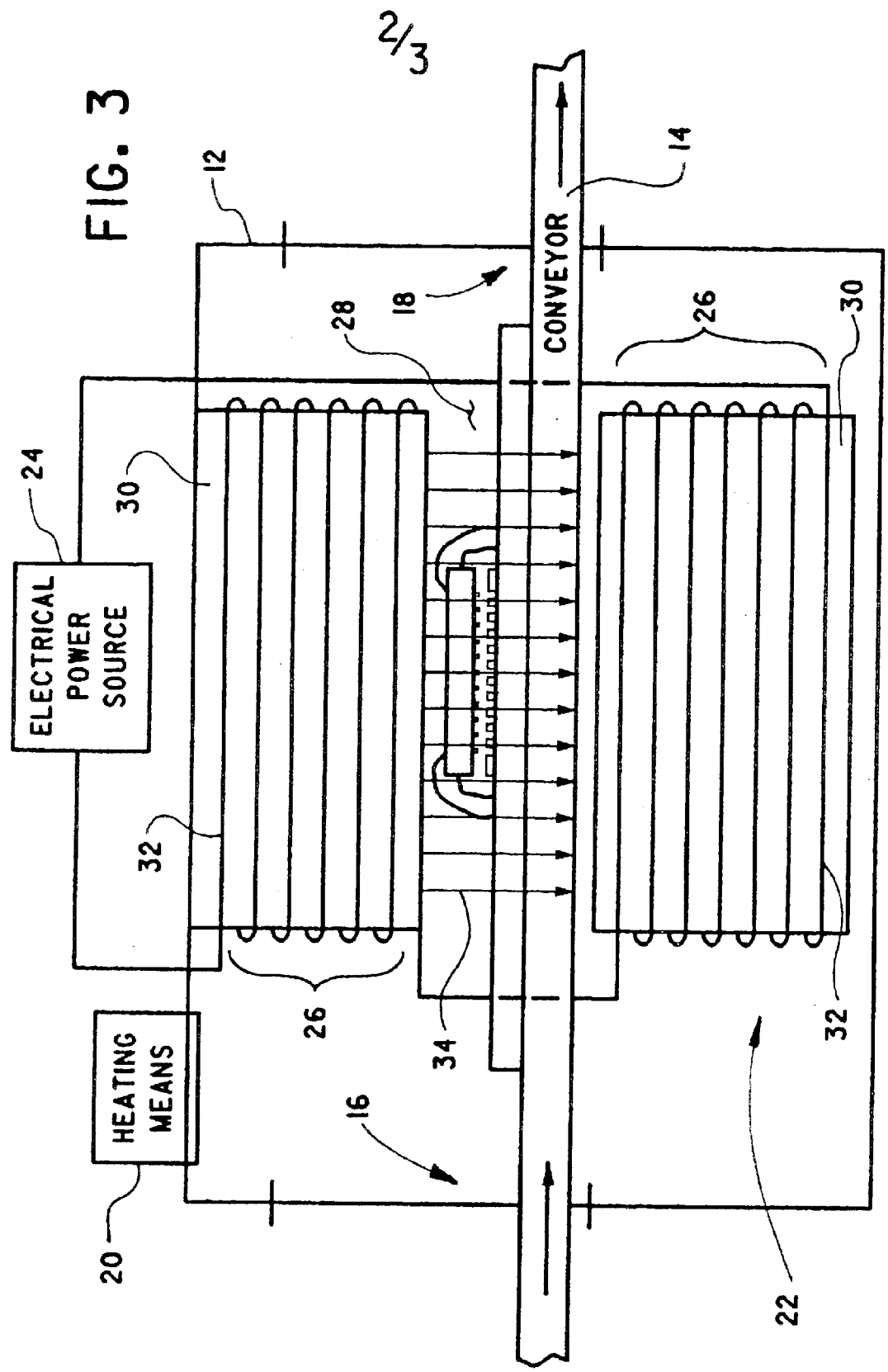

ANISOTROPIC CONDUCTIVE COMPOUND

BACKGROUND OF THE INVENTION

1. Field of the Invention

The present invention relates to an anisotropic conductive compound or material and a method of curing thereof.

2. Description of Related Art

Anisotropic conductive compounds are utilized to form conductive paths between pairs of aligned contacts, such as a contact on an integrated circuit or integrated circuit package and a contact of a printed circuit board. A typical anisotropic conductive compound includes conductive particles suspended in a binder. Such anisotropic conductive compound can be interposed in an uncured state between the integrated circuit or integrated circuit package and the substrate whereafter the anisotropic conductive compound can be cured to form conductive paths between contacts on the integrated circuit or integrated circuit package and the substrate while, at the same time, bonding the integrated circuit or integrated circuit package to the substrate.

Heretofore, anisotropic conductive compounds of the type described above were formed into a film which was interposed between the integrated circuit or integrated package and the substrate whereupon, with the application of pressure between the integrated circuit or integrated circuit package and the substrate in the presence of a curing heat, the conductive paths between aligned contacts of the integrated circuit or integrated circuit package and substrate, and the bonding of the integrated circuit or integrated circuit package to the substrate occurs.

A problem with prior art anisotropic conductive compounds is that they require the use of pressure and curing heat in order to form the conductive paths at the same time the bond is formed between the integrated circuit or integrated circuit package and the substrate. Another problem is that the film form of the prior art anisotropic conductive compounds requires special machinery in order to utilize the film in a production environment. Still, another problem is that the prior art anisotropic conductive compounds cannot effectively be utilized with integrated circuits, integrated circuit packages or substrates having adjacent contacts with edge-to-edge spacings less than about 300 µm.

It is, therefore, an object of the present invention to overcome the above problems and others by providing an improved anisotropic conductive compound and a method of curing thereof. Still other objects will become apparent to those of ordinary skill in the art upon reading and understanding the following detailed description.

SUMMARY OF THE INVENTION

Accordingly, I have invented anisotropic conductive material comprising electrically conducting material suspended in a binder. The electrically conducting material includes at least one of (i) nickel coated particles having a coating of noble metal, such as silver or gold, over the nickel coat and (ii) gold or silver coated nickel particles.

The particles having the nickel and gold, or silver coatings include at least one of carbon/graphite spheres, glass spheres and mica particles or flakes. The glass spheres can be solid or hollow. The gold or silver coated nickel particles can have a spherical shape, a flake-like shape or some combination thereof.

Where it is desired to form electrically isolated conductive paths between adjacent aligned pairs of contacts having an edge-to-edge spacing as close as 80 µm, the particles including their coatings can have an average maximum dimension between 10 µm and 25 µm. For adjacent aligned pairs of contacts having a larger edge-to-edge spacing, the use of particles including their coatings having a larger average maximum dimension can be considered.

The binder is formed from the reaction product of a catalyst and a compound that includes an aromatic epoxy resin, a dimer fatty acid diglycidyl ester and an oxirane. The catalyst can include a quaternary cyanyl R-substituted amine. The aromatic epoxy resin can be formed from the reaction product of bisphenol-A and epichlorohydrin.

The binder can further include a UV curable modifier formed from the reaction product of a $C_1$–$C_{20}$ linear or branched alkyl (meth)acrylate, a (meth)acrylated urethane and a $C_1$–$C_{20}$ linear or branched hydroxy alkyl ketone. The binder can further include a phenolic resin. The phenolic resin may be a novalac resin formed as the reaction product of formaldehyde and one of phenol, cresol and bisphenol-A.

Alternatively, the binder can be formed from the reaction product of a novalac resin, a catalyst and one of a thermally polymerized aromatic epoxy resin and a phenoxy modified epoxy novalac resin.

The viscosity of the uncured anisotropic conductive material typically decreases with temperature. At 25° C., the uncured anisotropic conductive material has a viscosity of at least 20,000 cps, in some cases at least 25,000 cps and in other cases at least 30,000 cps. Further the 25° C. viscosity of the uncured anisotropic conductive material is up to 100,000 cps, in some cases up to 75,000 cps, in other cases up to 50,000 cps and in some instances up to 45,000 cps. The 25° C. viscosity of the uncured anisotropic conductive material may vary between any of the viscosities recited above. Between 75° C. and 150° C., the viscosity of the uncured anisotropic conductive material is less than 10,000 cps, in many cases under 5,000 cps, in other cases less than 1,000 cps, in some instances less than 500 cps, in other instances less than 100 cps, and typically less than 50 cps. The viscosity of the anisotropic conductive material is measured utilizing a Brookfield Viscometer, such as Brookfield Viscometer model LVT, with a number 6 spindle at 10 RPM and 25° C.

I have also invented a method of forming an electronic assembly. The method includes providing a substrate having a first arrangement of conductive contacts and providing an electronic component having a second arrangement of conductive contacts. An uncured anisotropic conductive material is deposited on the first arrangement of conductive contacts and the electronic component is positioned thereon with each conductive contact of the first arrangement aligned with a corresponding conductive contact of the second arrangement. The anisotropic conductive material is heated to a curing temperature for a curing interval sufficient to cause it to cure to a solid. During heating of the anisotropic conductive material, it is subjected to an AC magnetic field followed by a static, substantially homogeneous DC magnetic field. Each magnetic field has a field vector direction that is substantially parallel with the alignment of each conductive contact of the first arrangement with the corresponding contact of the second arrangement. The DC magnetic field can have a magnetic field strength between 400 and 1,500 gauss. The frequency of the AC magnetic field can be in the ultrasonic frequency range, namely, between about 20 kHz and about 500 kHz. The curing temperature and the curing interval can be between 70° C. for about thirty minutes and 150° C. for about 5 to 7 minutes.

The method can further include, after the electronic component positioned on the anisotropic conductive material and before the anisotropic conductive materials heated to its curing temperature, applying a UV curable adhesive between the substrate and the electronic component and exposing the UV curable adhesive to UV light to cause the UV curable adhesive to cure.

BRIEF DESCRIPTION OF THE DRAWINGS

FIG. 3 is a schematic representation of a curing oven having a magnetic field generator therein for curing the anisotropic conductive material sandwiched between the integrated circuit package and the substrate in FIG. 2b;

DETAILED DESCRIPTION OF THE INVENTION

Figure 1:
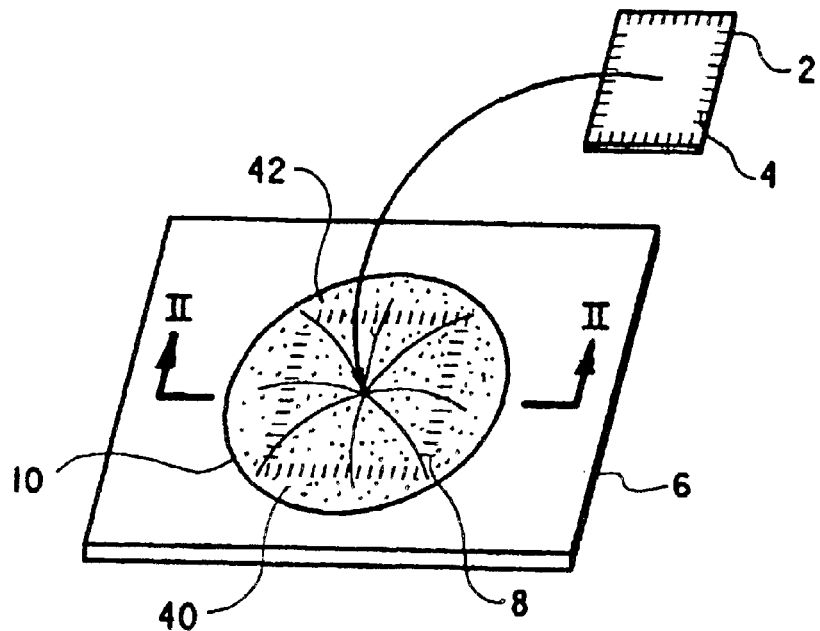
FIG. 1 is a perspective view of the positioning of an integrated circuit package on an anisotropic conductive material in accordance with the present invention deposited on a substrate.

The present invention is an anisotropic conductive material and a method of curing thereof. The invention will first be described in connection with the method of curing the anisotropic conductive material followed by a description of an exemplary anisotropic conductive material that has been found to be particularly suitable for use in forming conductive paths between conductive contacts of an integrated circuit or integrated circuit package and conductive contacts on a substrate that are in alignment with the conductive contacts on the integrated circuit or integrated circuit package while avoiding shorts between adjacent conductive paths. The material is particularly suitable for creating isolated conductive paths between contacts of an integrated circuit and contacts of a substrate having an edge-to-edge spacing less than 250 μm and as small as about 80 μm to 100 μm. An advantage of the present invention is that the method of curing the anisotropic conductive material does not require pressure to be applied between the integrated circuit or integrated circuit package and the substrate. Rather, the weight of the integrated circuit or integrated circuit package acting upon the anisotropic conductive material deposited on the substrate in combination with the method for curing the anisotropic conductive material described hereinafter is sufficient to create conductive paths between contacts of the integrated circuit or integrated circuit package and the contacts on the substrate in alignment therewith while avoiding electrical shorting between adjacent conductive paths.

Other than in the operating examples, or where otherwise indicated, all numbers expressing quantities of ingredients, reaction conditions and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention.

Also, it should be understood that any numerical range recited herein is intended to include all sub-ranges subsumed therein. For example, a range of "1 to 10" is intended to include all sub-ranges between and including the recited minimum value of 1 and the recited maximum value of 10, that is, having a minimum value equal to or greater than 1 and a maximum value of equal to or less than 10. Because the disclosed numerical ranges are continuous, they include every value between the minimum and maximum values. Unless expressly indicated otherwise, the various numerical ranges specified in this application are approximations.

As used herein, the term "polymer" is meant to encompass oligomers, and includes without limitation both homopolymers and copolymers. As used herein, "(meth) acrylate" and like terms are intended to include both acrylates and methacrylates.

As used herein the term aryl refers to aromatic groups that include, without limitation, groups such as phenyl, biphenyl, benzyl, xylyl, napthalenyl, anthracenyl and the like, as well as heterocyclic aromatic groups that include, without limitation, pyridinyl, pyrrolyl, furanyl, thiophenyl, and the like.

With reference to FIG. 1, an integrated circuit package 2 includes a plurality of closely spaced contacts positioned on or adjacent the edges of package 2. In FIG. 1, package 2 is illustrated as a leadless chip carrier package. However, this is not to be construed as limiting the invention since use of the anisotropic conductive material of the present invention with other surface mount integrated circuit packages, such as ball grid arrays, dual inline or quad packages having gull-wing or j-shaped leads, and quad flat packs having laterally extending leads or any other form of integrated circuit package having closely spaced leads, is envisioned. In addition, use of the anisotropic conductive material of the present invention with unpackaged integrated circuits for flip-chip mounting thereof is also envisioned.

As shown in FIG. 1, package 2 is received on a substrate 6 having a plurality of closely spaced contacts 8 disposed in mirror image relation to contacts 4 of package 2. Prior to mounting package 2 on substrate 6, a drop or coating of uncured anisotropic conductive material 10 is deposited on substrate 6 over the plurality of contacts 8.

Figure 2A:
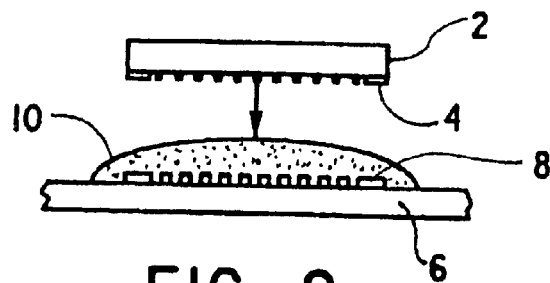
FIG. 2a is a view of the integrated circuit package in spaced relation to the substrate and conductive material taken along section lines II—II in FIG. 1.
Figure 2B:
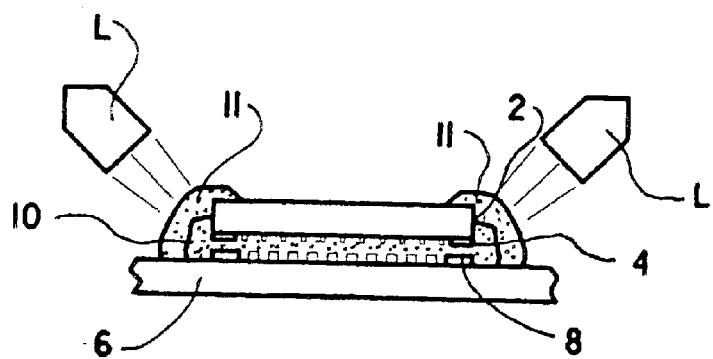
FIG. 2b is a view of the integrated circuit package in contact with the anisotropic conductive material deposited on the substrate taken along section lines II—II in FIG. 1.

With reference to FIGS. 2a and 2b, and with continuing reference to FIG. 1, next, integrated circuit package 2 is positioned with its contacts 4 in opposition with the contacts 8 of substrate 6. More specifically, each contact 4 of integrated circuit package 2 is positioned in alignment with a corresponding contact 8 of substrate 6. Thereafter, as shown in FIG. 2b, integrated circuit package 2 is moved into contact with anisotropic conductive material 10. In response to this contact, anisotropic conductive material 10 displaces somewhat. However, the viscosity of anistropic conductive material 10 is such that contacts 4 of integrated circuit package 2 and contacts 8 of substrate 6 are maintained in spaced relation by anisotropic conductive material 10. Importantly, integrated circuit package 2 is moved into contact with anisotropic conductive material 10 in a manner so that contacts 4 of integrated circuit package 2 and contacts 8 of substrate 6 are not in physical contact with each other and the displacement of anisotropic conductive material 10 is due primarily to the weight of integrated circuit package 2, and only slightly due to the force utilized to move integrated circuit package 2 into contact with anisotropic conductive material 10.

After integrated circuit package 2 is deposited on anisotropic conductive material 10 with each contact 4 in alignment with a corresponding contact 8 of substrate 6, a UV curable adhesive 11 is deposited between substrate 6 and integrated circuit package 2. The UV curable adhesive can be deposited around the perimeter of integrated circuit package 2. However, in practice, it is only necessary to deposit UV curable adhesive 11 on two or more corners of integrated circuit package 2.

After UV curable adhesive 11 has been deposited, it is exposed to UV light from one or more light sources L for a sufficient interval to cause UV curable adhesive 11 to commence curing. In addition, if anisotropic conductive material 10 includes a UV curable component, exposure to the UV light from the one or more light sources L also causes this component to commence curing. Optionally, instead of using UV curable adhesive 11, another form of adhesive that can be cured independent of anisotropic conductive material 10 can be utilized. However, UV curable adhesive 11 is preferred since it can be cured without exposing it and anisotropic conductive material 10 to an elevated curing temperature.

With reference to FIG. 3, and with ongoing reference to all previous Figs., after UV curable adhesive 11 has cured the entire assembly, including integrated circuit 2, substrate 6 and anisotropic conductive material 10, is positioned in a curing oven 12. In a production environment, curing oven 12 can have a conveyor 14 which extends through curing oven 12 between an inlet 16 and outlet 18 thereof for transporting the assembly therethrough. Alternatively, curing oven 12 can be an enclosure of any suitable shape and size in which the assembly can be positioned.

Curing oven 12 includes a heating means 20 for heating the atmosphere, e.g., air, inside of curing oven 12 in a manner known in the art. Curing oven 12 also includes a magnetic field generator 22 disposed therein which is coupled to and controlled by an electrical power source 24 disposed external to curing oven 12. Magnetic field generator 22 includes a pair of poles 26 disposed in spaced relation across a gap 28 in which integrated circuit package 2 deposited on anisotropic conductive material 10 received on substrate 6 is positioned in or passes through on conveyor 14. Each pole 26 includes a pole element 30 of ferromagnetic or paramagnetic material having one or more windings 32 of wire or other suitable conductive material formed therearound in a manner known in the art. Windings 32 are electrically insulated from pole elements 30 by a suitable insulator on pole elements 30 and/or a suitable insulator around the wire or other conductive material forming windings 32. Windings 32 of each pole 26 are connected to each other and to electrical power source 24 in a manner whereupon, in response to electrical power source 24 supplying windings 32 with a suitable electrical current, a magnetic field 34 is generated across gap 28.

Poles 26 are configured so that magnetic field 34 is highly homogeneous, at least where integrated circuit package 2 received on anisotropic conductive material 10 deposited on substrate 6 is positioned in curing oven 12 during curing of anisotropic conductive material 10. Magnetic field 34 preferably has a homogeneity of greater than 98.5%, but can have a homogeneity as low as 95%.

Figure 4:
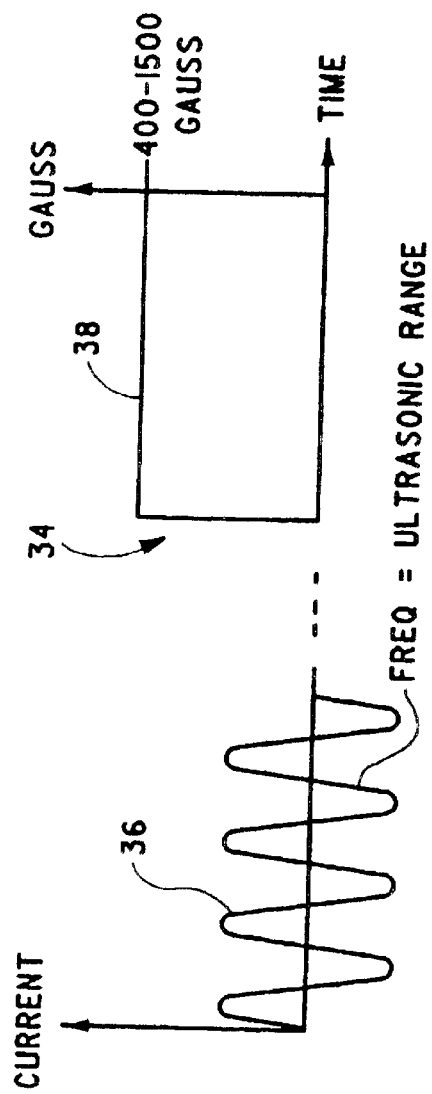
FIG. 4 is a plot of current versus time and field strength versus time for the current though the windings of the magnetic field generator and the magnetic field produced thereby, respectively, in FIG. 3.

With reference to FIG. 4, and with continuing reference to all previous Figs., initially electrical power source 24 applies an alternating current signal 36 to windings 32 for a duration between 15 and 30 seconds followed by a direct current signal 38 for the remainder of the curing time of anisotropic conductive material 10. The amplitude of the alternating current signal 36 can be selected based on the sizes of particles (discussed hereinafter) forming anisotropic conductive material 10. The amplitude of alternating current signal 36 is selected so that magnetic field 34 has an alternating magnetic field strength between 10 and 100 gauss. The value of direct current signal 38 is selected so that magnetic field 34 has a static magnetic field strength between 400 and 1,500 gauss.

Magnetic field 34 includes the alternating magnetic field produced by magnetic field generator 22 in response to alternating current signal 36 and the static magnetic field produced by magnetic field generator 22 in response to direct current signal 38. It has been observed that alternating current signal 36 operating in the ultrasonic frequency range, namely, between about 20 kHz and about 500 kHz, works best with anisotropic conductive material 10. However, this is not to be construed as limiting the present invention since other frequencies outside of the ultrasonic frequency range can also be utilized.

At a suitable time, the assembly is positioned in curing oven 12 in the presence of magnetic field 34. Curing oven 12 is heated or preheated to a suitable curing temperature for anisotropic conductive material 10 and the assembly is subjected to this curing temperature for a suitable curing interval while in the presence of magnetic field 34. Because of its nature, the curing temperature and the curing interval of anisotropic conductive material 10 can vary between 70° C. for about 30 minutes to 150° C. for about 5–7 minutes.

Figure 5:
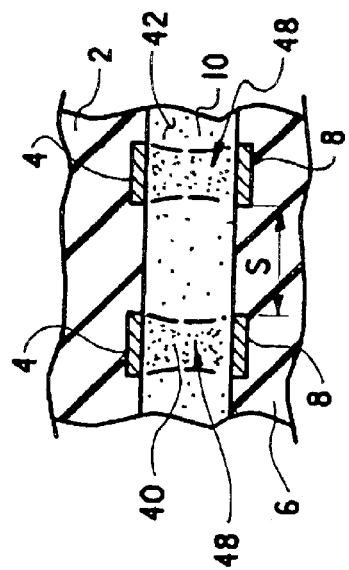
FIG. 5 is an close-up isolated diagrammatic cross-section of a pair of isolated parallel conductive paths of cured anisotropic conductive material in accordance with the present invention showing the distribution of the electrically conducting material in the binder.

With reference to FIG. 5, and with continuing reference to all previous Figs., once cured to a solid, anisotropic conductive material 10 forms a conductive path between each contact 4 of integrated circuit package 2 and a corresponding contact 8 of substrate 6 in alignment therewith. It has been observed that cured anisotropic conductive material 10 can form electrically conductive, but isolated parallel conductive paths 48 between adjacent pairs of aligned contacts having an edge-to-edge spacing S as close as 80 μm. This is a vast improvement over prior art anisotropic conductive materials which, when cured, have difficulty maintaining electrical isolation between adjacent conductive paths between adjacent pairs of aligned contacts having an edge-to-edge spacing below 250 μm.

As shown in FIG. 1, anisotropic conductive material 10 includes an electrically conducting material 40 suspended in a binder 42. Electrically conducting material 40 includes one or more types of particles coated with a noble metal such as gold or silver. The particles forming electrically conducting material 40 can include one or more of the following: solid nickel coated spheres, solid nickel flakes, solid carbon/graphite spheres, solid glass spheres, solid mica particles or flakes and hollow glass spheres. As used herein, the terms sphere or spheres generally means that the particles are ball-shaped, egg-shaped or minor variations of ball-shaped and egg-shaped.

The solid carbon/graphite spheres, the solid glass spheres, the solid mica particles or flakes and the hollow glass spheres each include a coating of nickel between the outside surface of the sphere and the coating of noble metal. The coating of nickel on these otherwise non-magnetic materials renders them susceptible to the influence of magnetic field 34.

Each particle along with the one or more coatings thereon has a maximum dimension less than 100 $\mu$m, preferably less than 80 $\mu$m and more preferably between 10 $\mu$m and 25 $\mu$m. As used herein, the term "maximum dimension" means the largest dimension of the particle measured in any direction. For example, if a particle is a sphere, the maximum dimension is the outside diameter of the noble metal deposited on the sphere. If the particle is a flake having an irregular shape, the maximum dimension is the dimension between the two points of the noble metal deposited over the particle that are farthest apart.

It has been observed that particles having an average maximum dimension between 10 $\mu$m and 25 $\mu$m enables the formation of parallel isolated conductive paths between adjacent pairs of aligned contacts having an edge-to-edge spacing as close as 80 $\mu$m. Obviously, a plurality of particles having this average maximum dimension will have some particles having less than 10 $\mu$m, e.g., 5 $\mu$m, and some particles having a maximum dimension greater than 25 $\mu$m. To this end, it has been observed that in a population of particles forming electrically conducting material 40 with an average maximum dimension between 10 $\mu$m and 25 $\mu$m, some of the particles can have a maximum dimension as small as 5 $\mu$m.

A first embodiment anisotropic conductive material 10 includes binder 42 formed from the reaction product of between 82% and 91% by weight of a compound and no more than about 6% by weight of a catalyst. The compound includes about one-third by weight of each of an aromatic epoxy resin, a dimer fatty acid diglycidyl ester and an oxirane. Any suitable aromatic epoxy resin may be used in the compound. Suitable aromatic epoxy resins include, but are not limited to diglycidyl ethers of bisphenol-A and bisphenol-F and other such resins, such as those available from EPON Resins from Resolution Performance Products, Houston, Tex. Any suitable dimer fatty acid diglycidyl ester may be used in the compound. Suitable dimer fatty acid diglycidyl esters include those of the formula:

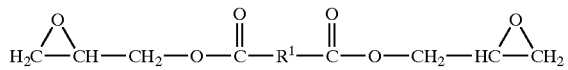

where R is $C_1$–$C_{20}$ alkylene, arylene or alkarylene.

Any suitable oxirane may be used in the compound. Suitable oxiranes include those of the formula:

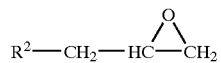

where $R^2$ is linear or branched $C_1$–$C_{20}$, alkyl, aryl, alkaryl, or is derived from a poly ether of the formula:

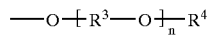

where $R^3$ is a linear or branched $C_1$–$C_{12}$ alkylene and $R^4$ is a linear or branched $C_1$–$C_{20}$ alkyl, aryl or alkaryl group, and "n" is an integer from 1 to 100. In an embodiment of the invention, the oxirane is (butoxy methyl)-butyl glycidyl ether. In one non-limiting embodiment, the aromatic epoxy resin is the reaction product of about one-half by weight of each of bisphenol-A and epichlorohydrin. In one non-limiting embodiment, the catalyst includes a quaternary cyanyl R-substituted amine. The R group in the quaternary cyanyl R-substituted amine may be a $C_1$–$C_{20}$ linear or branched alkyl, aryl or aralkyl group. In this first embodiment anisotropic conductive material 10, electrically conducting material 40 includes between 2.5% and 7% by weight of solid nickel spheres coated with silver and between 2.5% and 7% by weight of solid nickel flakes coated with silver.

A second embodiment anisotropic conductive material 10 includes the same electrically conducting material as the first embodiment anisotropic conductive material 10 and a binder similar to binder 42 in the first embodiment anisotropic conductive material 10 described above except that the binder in this second embodiment includes about 10% by weight of a UV curable modifier which replaces a corresponding weight percentage of the compound. More specifically, binder 42 in the second embodiment anisotropic conductive material 10 is formed from the reaction product of the UV curable modifier, the catalyst and the above described compound. The UV modifier can be UV curable adhesive 11 of the type commonly used in the art to attach integrated circuit packages to substrates. One exemplary UV curable modifier is formed from the reaction product of between 8% and 12% by weight of a (meth)acrylate ester, between 76% and 84% by weight of (meth)acrylated urethane and between 4% and 5% by weight of a hydroxy alkyl aryl ketone.

Any suitable (meth)acrylate ester may be used in the UV curable modifier. Suitable (meth)acrylate esters include those of the formula:

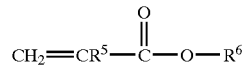

where $R^5$ is H or methyl and $R^6$ is a linear, branched or cyclic $C_1$–$C_{20}$ alkyl, aryl, alkaryl or aralkyl group. In an embodiment of the UV curable modifier, the (meth)acrylate ester is isobutyl (meth)acrylate. Any suitable hydroxy alkyl aryl ketone may be used in the UV curable modifier. Suitable hydroxy alkyl aryl ketones include those of the formula:

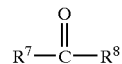

Where $R^7$ is a linear, branched or cyclic $C_2$–$C_{20}$ alkyl group containing at least one hydroxyl group and $R^8$ is a $C_6$–$C_{20}$ aryl, alkaryl or aralkyl group. In an embodiment of the UV curable modifier, the hydroxy alkyl aryl ketone is 1-hydroxy cycohexyl phenyl ketone.

A third embodiment anisotropic conductive material 10 includes binder 42 formed from the reaction product of between 8% and 12% by weight of the compound described above, between 71% and 79% of a phenolic resin, no more than about 6% by weight of a catalyst, such as a quaternary cyanyl R-substituted amine, and no more than about 12% by weight of the UV modifier system. Any suitable phenolic resin may be used in the present invention. Suitable phenolic resins include, but are not limited to, novalac resins and revol resins. In an embodiment of the invention, the phenolic resin is a novalac resin formed as the reaction product of formaldehyde and one or more of phenol, cresol, bisphenol-A and bisphenol-F. The quaternary cyanyl R-substituted amine is as described above. This binder 42 is mixed with about 14% by weight of an electrically conducting material 40 to form the third embodiment anisotropic conductive material 10. In this embodiment, electrically conducting material 40 is solid nickel spheres coated with gold.

A fourth embodiment anisotropic conductive material 10 includes binder 42 formed from the reaction product of between 71% and 79% by weight of phenolic resin, as described above, 8% to 12% by weight of a thermally polymerized aromatic epoxy resin and no more than about 6% by weight of a catalyst, such as quaternary cyanyl R-substituted amine as described above. The electrically conducting material 40 added to this fourth embodiment binder 42 to form anisotropic conductive material 10 includes about 10% by weight of solid carbon/graphite spheres having a coating of gold over a coating of nickel and about 4% by weight of solid glass spheres having a coating of gold over a coating of nickel.

A fifth embodiment anisotropic conductive material 10 includes binder 42 formed from the reaction product of between 71% and 79% by weight of a phenolic resin, as described above, 8% to 12% by weight of a phenoxy modified epoxy novalac resin and no more than about 6% by weight of a catalyst, such as quaternary cyanyl R-substituted amine as described above. The electrically conducting material 40 of the fifth embodiment anisotropic conductive material 10 includes about 10% by weight of solid carbon/graphite spheres having a coating of gold over a coating of nickel and about 4% by weight of solid glass spheres having a coating of gold over a coating of nickel.

When the particles comprising electrically conducting material 40 of the first through fifth embodiments of anisotropic conductive material 10 have an average maximum dimension between 10 $\mu$m and 25 $\mu$m and when each of these anisotropic conductive materials 10 are cured in the above described manner, adjacent parallel isolated conductive paths having an edge-to-edge spacing as close as 80 $\mu$m were observed in cross sections of the cured anisotropic conductive material 10. The isolation of these adjacent parallel isolating conductive paths was confirmed by electrical measurement thereof.

The first through fifth embodiments of anisotropic conductive material 10 were utilized to attach 20 pin integrated circuits to substrates and to electrically connect each contact of the integrated circuit to a corresponding contact of the substrate to which the integrated circuit was attached. The contact resistance between one or more contacts of each integrated circuit and the corresponding embodiment of anisotropic conductive material 10 were measured and the following results were observed. The first through third embodiments of anisotropic conductive material 10 exhibited a higher contact resistance than the fourth and fifth embodiments of anisotropic conductive material 10. In addition, the first through third embodiments of anisotropic conductive material exhibited a contact resistance that varied as much as one order of magnitude greater than the contact resistance variance of the fourth and fifth embodiments of anisotropic conductive material 10. More specifically, the contact resistance of the first through third embodiments of anisotropic conductive material 10 varied up to 20%. In contrast, the contact resistance of the fourth and fifth embodiments of anisotropic conductive material 10 varied between 2% and 4%.

Moreover, the stability of the contact resistance of the first through third embodiments of anisotropic conductive material 10 increased or decreased by as much as 60% when exposed to 95% relative humidity at 40° C. for 1,000 hours. Furthermore, when the first through third embodiments of anisotropic conductive material 10 were exposed to 60° C. for 1,000 hours, the contact resistance increased or decreased by as much as 15%. Lastly, when the first through third embodiments of anisotropic conductive material 10 were exposed to a temperature of −40° C. for 1,000 hours, the contact resistance increased or decreased by as much as 20%.

In contrast, the contact resistance of the fourth and fifth embodiments of anisotropic conductive material 10 increased or decreased by only about 7% when exposed to 95% relative humidity at 40° C. for 1,000 hours. Moreover, when the fourth and fifth embodiments of anisotropic conductive material 10 were exposed to a temperature of 60° C. for 1,000 hours, the contact resistance of each contact increased or decreased only about 5%. Lastly, when the fourth and fifth embodiments of anisotropic conductive material 10 were exposed to a temperature of −40° C. for 1,000 hours, the contact resistance of each contact increased or decreased only about 5%.

The foregoing embodiments of anisotropic conductive material 10 have a viscosity between 30,000 centi-poise and 45,000 centi-poise at 25° C. and a viscosity of less than 50 centi-poise between 75° C. and 150° C. This drastic change in viscosity in combination with the exposure of anisotropic conductive material 10 to a suitable curing temperature in the presence of magnetic field 34 enables the electrically conducting material 40 suspended in binder 42 to align under the influence of magnetic field 34 to form adjacent, but electrically isolated, parallel conductive paths between adjacent pairs of aligned contacts having an edge-to-edge spacing as close as 80 $\mu$m.

It is believed that electrically conducting material 40 formed from solid mica particles or flakes and/or hollow glass spheres having a coating of noble metal, such as gold or silver, over a coating of nickel will reduce the edge-to-edge spacing of adjacent parallel isolated conductive paths that can be realized over the edge-to-edge spacing realized utilizing similarly sized solid nickel spheres coated with a coating of noble metal, solid carbon/graphite spheres having a coating of noble metal over a coating of nickel and/or solid glass spheres having a coating of noble metal over a coating of nickel. To this end, it is believed that the lower weight of the solid mica particles or flakes and/or the hollow glass spheres enables them to move more readily under the influence of magnetic field 34 before binder 42 hardens sufficiently to prevent their movement under the influence of magnetic field 34.

Obviously, smaller particle sizes forming electrically conducting material 40 of anisotropic conductive material 10 enables conductive paths to be formed between adjacent pairs of aligned contacts having a closer edge-to-edge spacing than larger particles. Thus, increasing and decreasing the average maximum dimension of the particles forming electrically conducting material 40 of anisotropic conductive material 10, increases and decreases the edge-to-edge spacing of adjacent pairs of aligned contacts that can be electrically connected by adjacent conductive paths without experiencing shorting between the adjacent conductive paths.

The present invention has been described with reference to the preferred embodiments. Obvious modifications and alterations will occur to others upon reading and understanding the preceding detailed description. It is that the invention be construed as including all such modifications and alterations insofar as they come within the scope of the appended claims or the equivalents thereof.

The invention is claimed to be:

1. An anisotropic conductive material configured to be cured in the presence of a magnetic field, said anisotropic conductive material comprising electrically conducting material suspended in a binder, said electrically conducting material comprising a plurality of non-magnetic particles, each of which is coated with a layer of nickel and a layer of electrically conductive material, said electrically conducting material forming electrically conductive and isolated parallel paths when cured in the presence of a magnetic field.

2. The anisotropic conductive material as set forth in claim 1, wherein each particle is formed from one of (i) carbon/graphite, (ii) glass and (iii) mica.

3. The anisotropic conductive material as set forth in claim 2, wherein each glass particle is at least one of a solid and a hollow glass sphere.

4. The anisotropic conductive material as set forth in claim 1, wherein each particle has a spherical shape.

5. The anisotropic conductive material as set forth in claim 1, wherein an average maximum dimension of the particles including their coatings is between 10 $\mu$m and 25 $\mu$m.

6. The anisotropic conductive material as set forth in claim 1, wherein the binder is formed from the reaction product of a catalyst and compound comprising an aromatic epoxy resin, a dimer fatty acid diglycidyl ester and an oxirane.

7. The anisotropic conductive material as set forth in claim 6, wherein the oxirane is a (butoxy methyl)-butyl glycidyl ether.

8. The anisotropic conductive material as set forth in claim 6, wherein the compound includes about one-third by weight of each of the aromatic epoxy resin, the dimer fatty acid diglycidyl ester and the oxirane.

9. The anisotropic conductive material as set forth in claim 6, wherein the catalyst includes a quaternary cyanyl R-substituted amine.

10. The anisotropic conductive material as set forth in claim 6, wherein the aromatic epoxy resin is formed from the reaction product of bisphenol-A and epichlorohydrin.

11. The anisotropic conductive material as set forth in claim 6, further wherein the binder further includes a UV curable modifier.

12. The anisotropic conductive material as set forth in claim 11, wherein the binder further includes a phenolic resin.

13. The anisotropic conductive material as set forth in claim 12, wherein the phenolic resin is a novalac resin.

14. The anisotropic conductive material as set forth in claim 13, wherein the novalac resin is formed from the reaction product of formaldehyde and one of phenol, cresol and bisphenol-A.

15. The anisotropic conductive material as set forth in claim 1, wherein the binder is formed from the reaction product of a phenolic resin, a catalyst and one of (i) a thermally polymerized aromatic epoxy resin and (ii) a phenoxy modified epoxy novalac resin.

16. The anisotropic conductive material as set forth in claim 15, wherein the phenolic resin is a novalac resin.

17. The anisotropic conductive material as set forth in claim 15, wherein the phenolic resin and the novalac resin are formed from the reaction product of formaldehyde and one of phenol, cresol and bisphenol-A.

18. The anisotropic conductive material as set forth in claim 1, wherein the electrically conductive material includes at least one of gold and silver.

19. The anisotropic conductive material as set forth in claim 1, wherein the layer of electrically conductive material on each particle overlays the nickel layer on the particle.

20. The anisotropic conductive material as set forth in claim 1, wherein the magnetic field is at least one of a DC magnetic field and an AC magnetic field.

* * * * *